United States Patent
Chen et al.

(10) Patent No.: US 9,231,596 B2
(45) Date of Patent: Jan. 5, 2016

(54) METHOD AND APPARATUS FOR A DUTY-CYCLED HARMONIC INJECTION LOCKED OSCILLATOR

(75) Inventors: Zhiming Chen, Singapore (SG); Kuang-Wei Cheng, Singapore (SG); Yuanjin Zheng, Singapore (SG); Minkyu Je, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 46 days.

(21) Appl. No.: 14/007,661

(22) PCT Filed: Mar. 28, 2011

(86) PCT No.: PCT/SG2011/000125
§ 371 (c)(1),
(2), (4) Date: Jan. 3, 2014

(87) PCT Pub. No.: WO2012/134393
PCT Pub. Date: Oct. 4, 2012

(65) Prior Publication Data
US 2014/0104010 A1    Apr. 17, 2014

(51) Int. Cl.
H03B 5/12 (2006.01)
H03L 7/00 (2006.01)
H03L 7/24 (2006.01)

(52) U.S. Cl.
CPC ............... *H03L 7/00* (2013.01); *H03B 5/1215* (2013.01); *H03B 5/1228* (2013.01); *H03B 5/1243* (2013.01); *H03L 7/24* (2013.01)

(58) Field of Classification Search
USPC ............................................ 331/117 FE, 167
See application file for complete search history.

(56) References Cited

U.S. PATENT DOCUMENTS

2010/0301955 A1* 12/2010 Luong et al. ............ 331/117 FE

* cited by examiner

*Primary Examiner* — Joseph Chang
(74) *Attorney, Agent, or Firm* — K. David Crockett, Esq.; Niky Economy Syrengelas, Esq.; Crockett & Crockett, PC (57) ABSTRACT

A method and an apparatus for a duty-cycled injection locked oscillator is provided for frequency shift keyed (FSK) signal transmissions. The oscillator includes a resonance LC tank and a first switching device. The first switching device is coupled to the resonance LC tank and injects an initial current pulse with a predetermined pulse magnitude into the resonance LC tank. The initial current pulse also fixes an initial phase of the duty-cycled injection locked free-running oscillator in response to the predetermined magnitude of the initial current pulse to enable fast settling of injection locking and high data rate operation of the duty-cycled injection locked oscillator. The oscillator also includes a second switching device, such as a differential pair of switching devices. The second switching device is coupled to the LC resonance tank for injecting a gated periodic reference signal having a duty cycle modified to reduce power of the reference signal by approximately seventy-five per cent.

4 Claims, 7 Drawing Sheets

PRIOR ART

METHOD AND APPARATUS FOR A DUTY-CYCLED HARMONIC INJECTION LOCKED OSCILLATOR

FIELD OF THE INVENTION

The present invention generally relates to ultra low power, wideband oscillators and more particularly relates to oscillators for low-power frequency shift-keying (FSK) transmitters.

BACKGROUND OF THE DISCLOSURE

In biomedical applications, tethering wires impose significant restrictions on the subject under investigation and limits the free movement. Therefore, a wireless transmitter is usually preferred to send out electro-biophysiological signals. For example, in the neural signal recording of a free-moving live subject, the recorded signal could substantially differ from that of a movement-restricted subject. In order to have concurrent access to multi-channel information in neural signal recording applications, the required transmission data rate is approximately 100 Mbps with 100 channels, even when on-the-fly signal processing and time-domain multiplexing techniques are applied.

Power consumption is also a key constraint to wireless transmitters in biomedical applications, especially when the transmitter is implanted. When powered by a battery or by wireless telemetry, the transmitter is designed to consume low power to avoid frequent battery replacement or excessive exposure of live subjects to electromagnetic waves. However, high data rate communications is difficult to realize in a limited power budget environment. For example phase-locked loop based oscillators typically are limited to generation of low data rate signals and require high power consumption. In conventional transmitters for low power biomedical applications, power consumption may be reduced by employing open-loop frequency synthesis techniques, such as open-loop voltage controlled oscillators. Such techniques, though, result in the generated frequency being inaccurate and unstable over process, voltage, and temperature variations, making demodulation at the receiver side more difficult.

Low power yet accurate frequency synthesis can be obtained through known injection locking techniques. For example, a free-running oscillator will lock to the fundamental or harmonics of an injected reference signal under the condition that the targeted harmonic is within the locking range of the oscillator. The major benefits of injection lock LC oscillators include low phase noise and low power consumption. However, the use of injection lock LC oscillators is limited to low data rate communications, even though LC oscillators are preferred for better phase noise performance. One major problem with injection lock oscillators is the variable locking time, which could be as long as three microseconds.

In biomedical applications, frequency-shift keying (FSK) modulation schemes are preferred due to their inherent superior performance in bit-error rate (BER) and interference rejection. The problem of indefinite locking time, however, still exists. For FSK modulation, conventionally the reference signal is generated by hopping from one frequency to another.

Thus, what is needed is a method and apparatus for low-power transmission of signals at a high data rate. Furthermore, other desirable features and characteristics will become apparent from the subsequent detailed description and the appended claims, taken in conjunction with the accompanying drawings and this background of the disclosure.

SUMMARY OF THE INVENTION

According to the Detailed Description, a method for fixing the initial phase of a free-running oscillator is provided for low power high data rate frequency shift-keying (FSK) communications. The method includes injecting an initial current pulse into the resonant LC tank of the free-running oscillator. The initial current pulse has a predetermined magnitude. The method also includes locking the free-running oscillator in response to a relationship between the predetermined magnitude of the initial current pulse and a phase of the free-running oscillator.

In addition, a method for signal generation as target harmonics of the free running LC oscillator for injection lock is provided. The method includes injecting a gated reference current signal into a resonance LC tank of the free running oscillator. The method further includes varying a duty cycle of the gated reference current signal to reduce power of the gated reference signal while maintaining substantially equivalent strength of injected harmonics.

Further, a duty-cycled injection locked oscillator is provided for frequency shift keyed (FSK) signal transmission. The oscillator includes a resonance LC tank and a first switching device. The first switching device is coupled to the resonance LC tank and injects an initial current pulse with a predetermined pulse magnitude into the resonance LC tank. The initial current pulse also fixes an initial phase of the free-running oscillator in response to the predetermined magnitude of the initial current pulse to enable fast settling of injection locking and high data rate operation of the duty-cycled injection locked oscillator.

BRIEF DESCRIPTION OF THE DRAWINGS

The accompanying figures, where like reference numerals refer to identical or functionally similar elements throughout the separate views and which together with the detailed description below are incorporated in and form part of the specification, serve to illustrate various embodiments and to explain various principles and advantages in accordance with the present invention.

Skilled artisans will appreciate that elements in the figures are illustrated for simplicity and clarity and do not necessarily include any non-essential elements of the transmitter. For example, the power amplifier and antenna of the present embodiments are only depicted in the block diagram of FIG. 3 and omitted in other figures. Those skilled in the art with the information disclosed herein will understand that the remaining circuitry can be designed in accordance with any of a number of conventional schemes.

DETAILED DESCRIPTION

The following detailed description is merely exemplary in nature and is not intended to limit the invention or the application and uses of the invention. Furthermore, there is no intention to be bound by any theory presented in the preceding background of the invention or the following detailed description of the invention.

Figure 1:
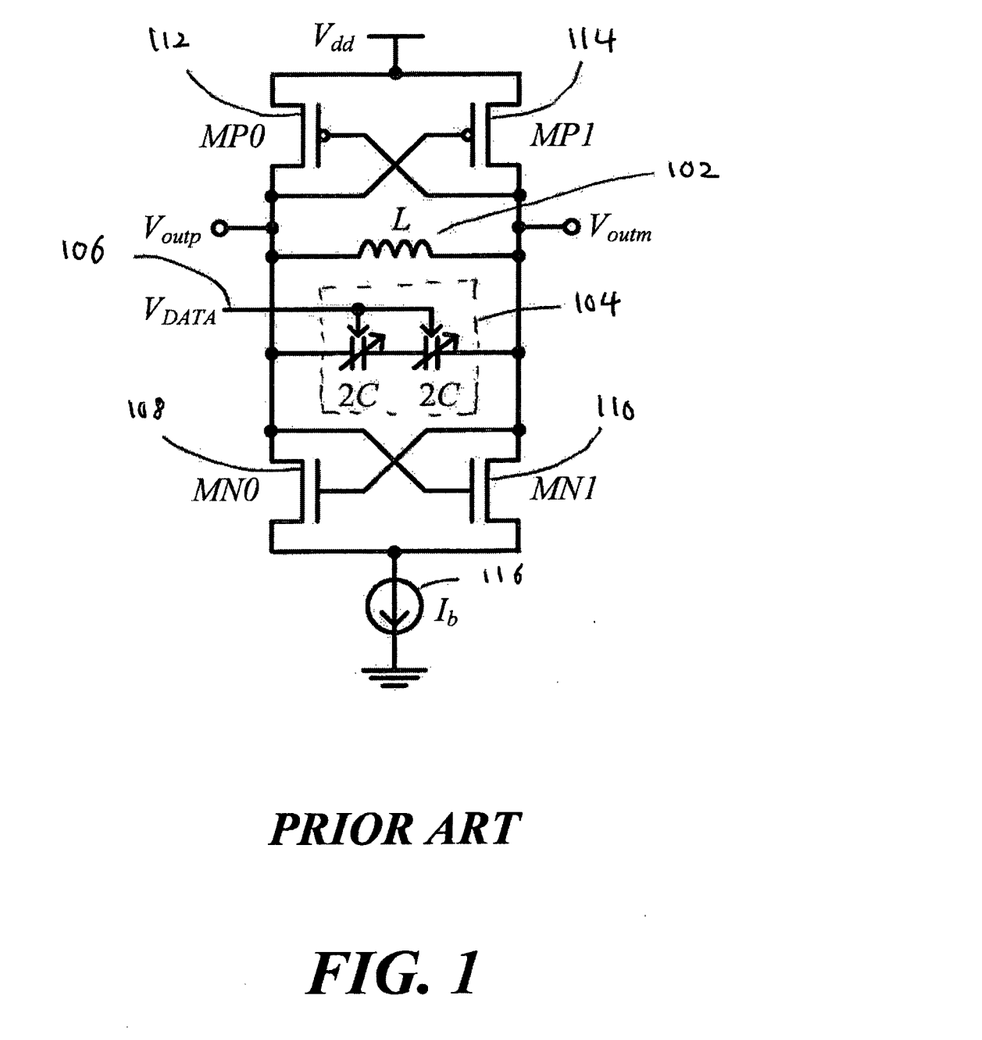
FIG. 1 is a circuit diagram of a conventional differential complementary cross-coupled LC oscillator.

Open-loop free-running oscillators are typically used to reduce power consumption in transmitters for biomedical applications. Referring to FIG. 1, a circuit diagram of a conventional complementary cross-coupled LC oscillator 100 is depicted. Such oscillators are typically used in biomedical transmitters because of its advantages of low power consumption and low phase noise. The LC oscillator includes coil L 102 and tunable capacitor banks 2C 104. Without locking to any reference signal, the oscillator 100 can run at a desired frequency by tuning the capacitor banks 2C 104 in response to signal $V_{DATA}$ on line 106. In biomedical applications, a frequency shift-keying (FSK) transmission scheme is usually adopted as the modulation scheme for the oscillator 100 because of the excellent bit-error rate (BER) performance and interference rejection, and the FSK modulation is realized by tuning the capacitor banks 2C 104. The resonance tank of the coil L 102 and the capacitor banks 2C 104 is accomplished by cross coupling transistor pair MN0 (108) and MN1 (110) and cross coupling transistor pair MP0 (112) and MP1 (114), while the LC oscillator is biased by current source $I_b$ 116.

While low power consumption could be achieved by the oscillator 100, it has a major disadvantage. Due to variations of process, voltage, and temperature, the oscillation frequency drifts over time. The frequency inaccuracy and instability makes demodulation difficult at the receiver side and increases the burden of the receiver.

Figure 2:
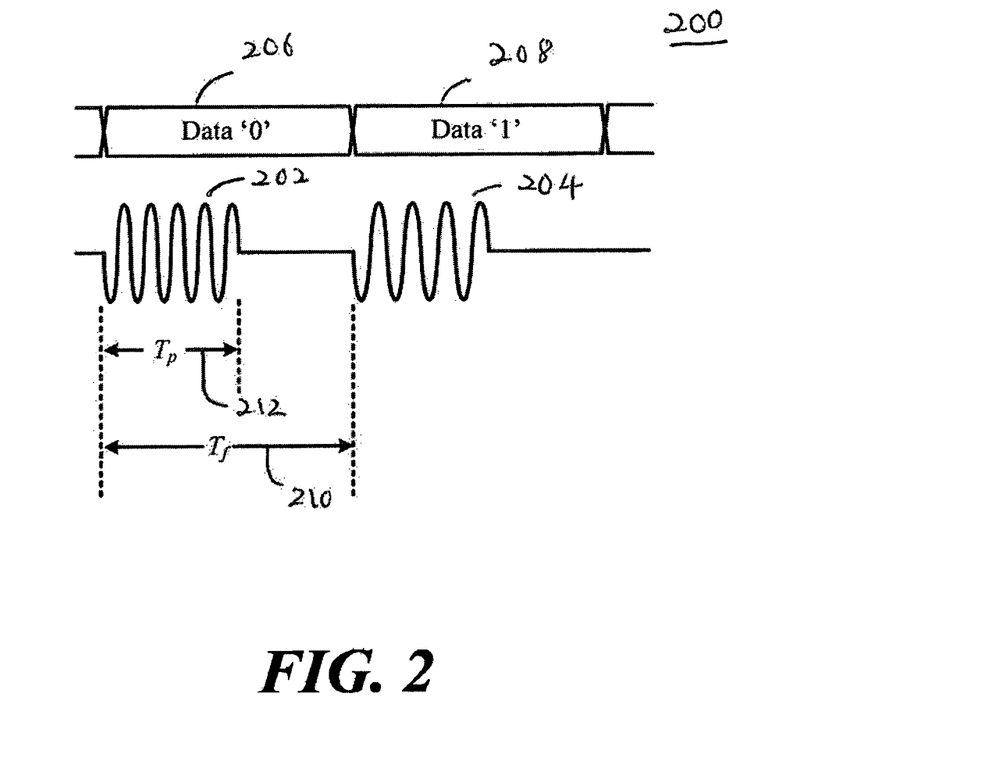
FIG. 2 is a signaling diagram of a duty-cycled transmitter output for frequency shift-keyed (FSK) transmissions in accordance with the present embodiment.

The present embodiment provides a promising candidate for low power yet accurate frequency synthesis utilizing the injection locking technique. The major benefits of injection lock oscillators include low phase noise and low power consumption. And a free-running oscillator will lock to the fundamental or harmonics of an injected reference signal when the targeted harmonic is within the locking range of the oscillator. Referring to FIG. 2, a signaling diagram 200 of a duty-cycled transmitter output for frequency shift-keying (FSK) transmissions in accordance with the present embodiment is depicted. The signaling diagram 200 depicts burst-mode operation of an FSK transmitter where the burst-mode output signal 202, 204 for each data element 206, 208 occupies only a fraction of the bit period 210. With the output pulse width of $T_p$ 212 and bit period of $T_f$ 210, the duty cycle of the transmitter output can be calculated as $$\eta = T_p/T_f \times 100\% \qquad [1]$$

Figure 3:
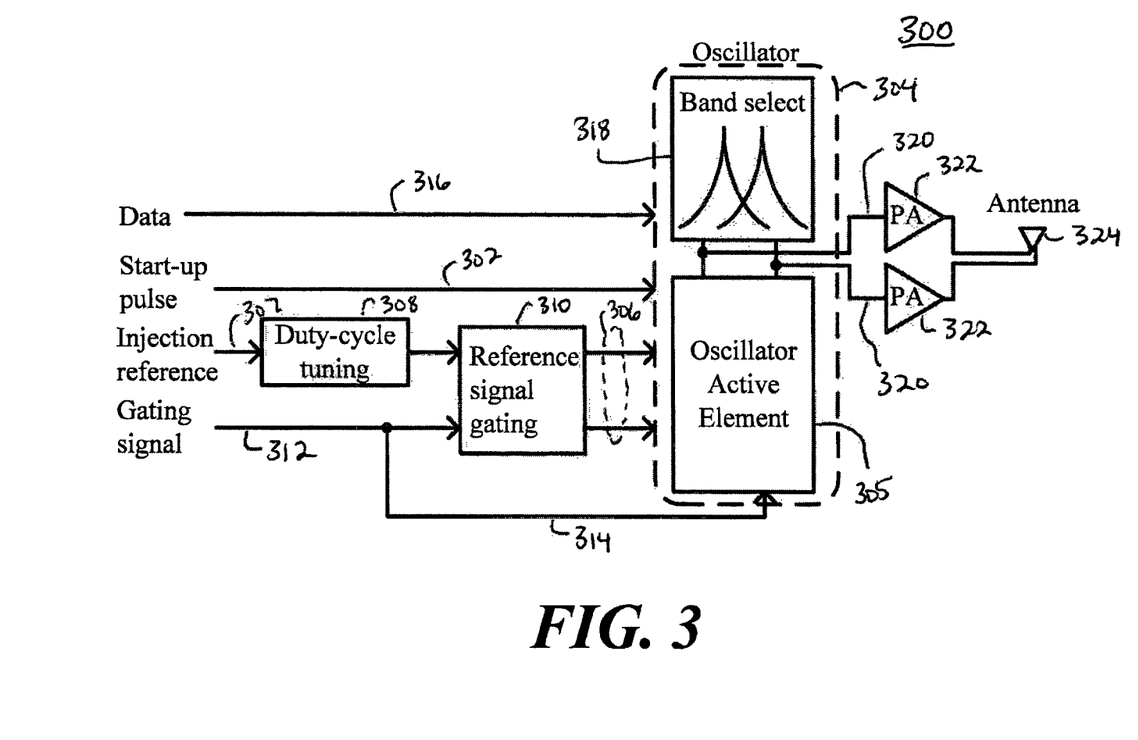
FIG. 3 is a block diagram of an injection-locked transmitter for burst mode FSK transmission in accordance with the present embodiment.

Referring to FIG. 3, a block diagram illustrates an injection-locked transmitter 300 for burst mode FSK transmission in accordance with the present embodiment. The transmitter 300 operates in burst mode to save power. An initial start-up pulse on line 302 quickly starts up an oscillator 304 and fixes the phase of the free-running oscillator 304, including active oscillator elements 305. With the knowledge of the phase of the free-running oscillator 304, a reference current signal can be injected on line 306 at the optimum timing to achieve fast locking. The optimum timing is accomplished by providing an injection reference signal 307 to a duty-cycle tuning block 308.

The output of the duty-cycle tuning block 308 is provided to a reference signal gating block 310 which generates the reference current signals for injection on lines 306 into the oscillator active elements 305 at optimal times. Meanwhile, a gating signal is provided to the reference signal gating block 310 on line 312. In accordance with the present embodiment, the reference signal has a duty cycle of 33.33% instead of a conventional 50% duty cycle. The modified duty cycle of the reference signal reduces the required power of the reference signal and produces balanced output power. The gating signal is also applied on line 314 to the oscillator active elements 305 and turns the oscillator 304 on and off to realize the burst mode operation.

In order to achieve FSK modulation, the data on line 316 sets a frequency band of the free running frequency in band select block 318 of the oscillator 304 close to one of two harmonics of the reference signal such that one of the harmonics always falls into the locking range of the free-running oscillator 304. The signals produced by the oscillator $V_{out}$ on lines 320 are amplified and sent to power amplifiers 322 and an antenna 324 for transmission. One major contribution to the advantageous operation of the FSK transmitter 300 in accordance with the present embodiment is that an initial current pulse is applied to fix the initial phase of the free-running oscillator. This current pulse also serves the purpose of enabling quick start-up of the oscillator and, with the known initial phase of the free-running oscillator, the injection reference signal has a target to quickly lock to. Therefore, the variable settling time in prior art solutions can be avoided and high data rate can be achieved. In addition, the adjusted duty cycle of the injection reference signal obtains two-fold benefits. One benefit is the power of the injected reference signal is reduced by approximately 75% with low orders of harmonics. And the other benefit is that harmonics of equal power can be obtained such that the transmitter 300 has the same locking condition and balanced power levels at the two different harmonic frequencies.

Figure 4:
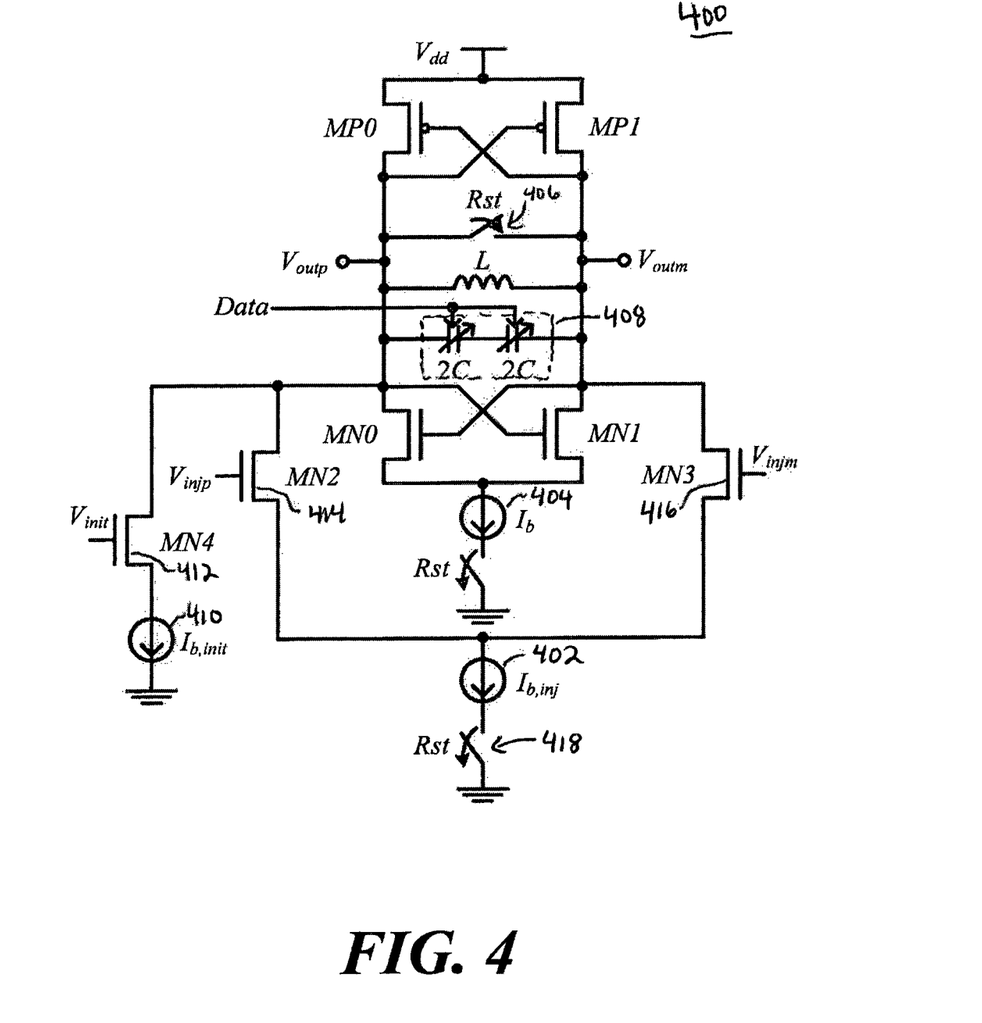
FIG. 4 is a circuit diagram of a duty-cycled harmonic injection-locked differential oscillator in accordance with the present embodiment.

A circuit diagram of a duty-cycled harmonic injection-locked oscillator 400 in accordance with the present embodiment is shown in FIG. 4. The oscillator 400 is a differential implementation of the injection lock oscillator for the FSK transmitter where both the oscillator 400 and the injection reference signal 402 are in differential modes to minimize the effect of power supply variations. The burst mode is realized by the signal Rst, which turns the oscillator and injection signal on and off by turning on and off switching devices 404, 406, and 418. When there is a data bit to be transmitted, the Rst signal is set to low and the tail current $I_b$ is supplied to start up the oscillator. The data bit also selects a proper capacitor bank 408 for FSK operation as is well-known to those skilled in the art of conventional open-loop oscillators for FSK transmission. The switching device 406 is set to open to allow oscillation to build up in the oscillator 400. When the burst mode data transmission is completed, the signal Rst is set to high. In response thereto, tail current $I_b$ is cut off and the oscillator differential output terminals $V_{outp}$ and $I_{outm}$ are shorted to speed up the turning off of the oscillator 400.

The free-running frequency of the oscillator 400 is set by the capacitor banks 408 to ensure the 4th and 5th harmonics of the reference signal are always within the locking range of the oscillator 400. The strength of the initial current pulse is set by the current source $I_{b,init}$ 410 and operated by a switching device 412, while the strength of the injection reference signal is determined by the current source $I_{b,inj}$ 402 and injected in a differential mode by the cooperative operation of a switching device 414 and a switching device 416. The differential injection signal $V_{injp}$ and $V_{injm}$ to the respective switching device 414 and 416 each has a duty cycle of 33.33%, instead of 50%. The start up of the oscillator 400 is speed up by the initial current pulse supplied through the switching device 412 and the phase of the oscillator 400 during free running is determined by the magnitude of the initial current pulse. The initial current pulse extends operation of the oscillator 400 to high data rate applications.

Figure 5:
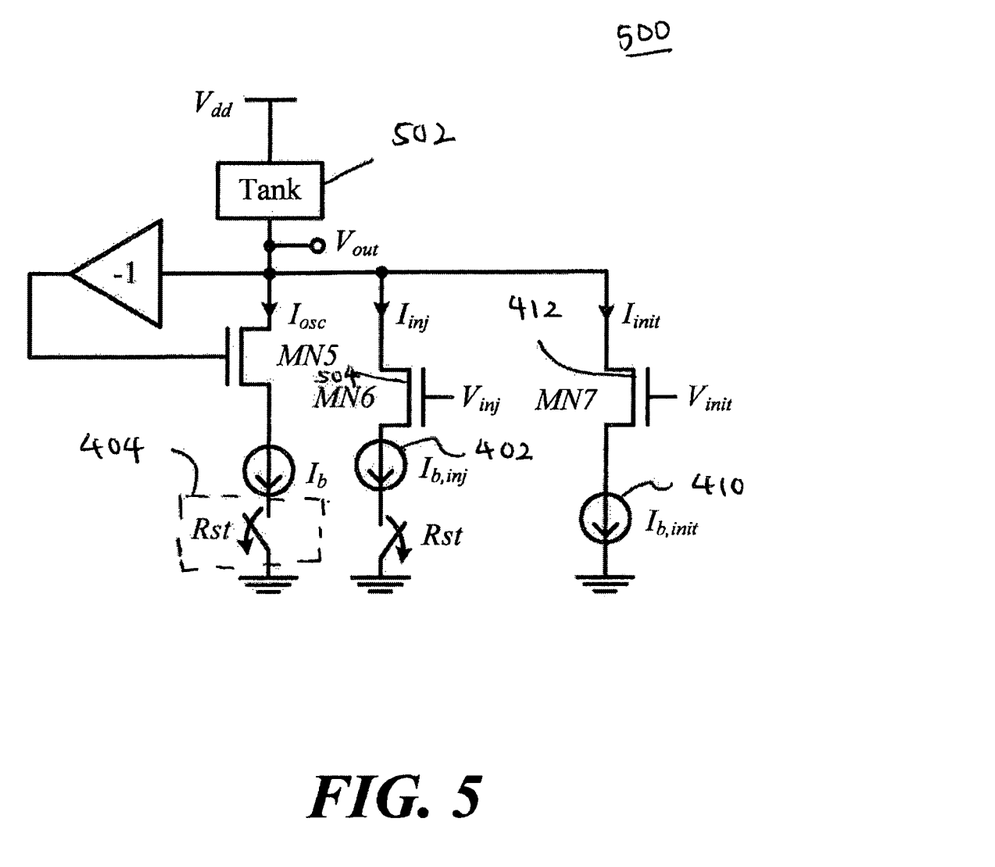
FIG. 5 is a circuit diagram of a single-ended representation for the differential oscillator of FIG. 4.

Referring to FIG. 5, a circuit diagram of a single-ended representation 500 for the differential duty-cycled injection locked oscillator 400 is depicted with an LC tank 502 for oscillating the signal and a switching device 504 for injecting the current pulse 402. The switching device 404 and the switching device 412 operate similarly to that described above.

Figure 6:
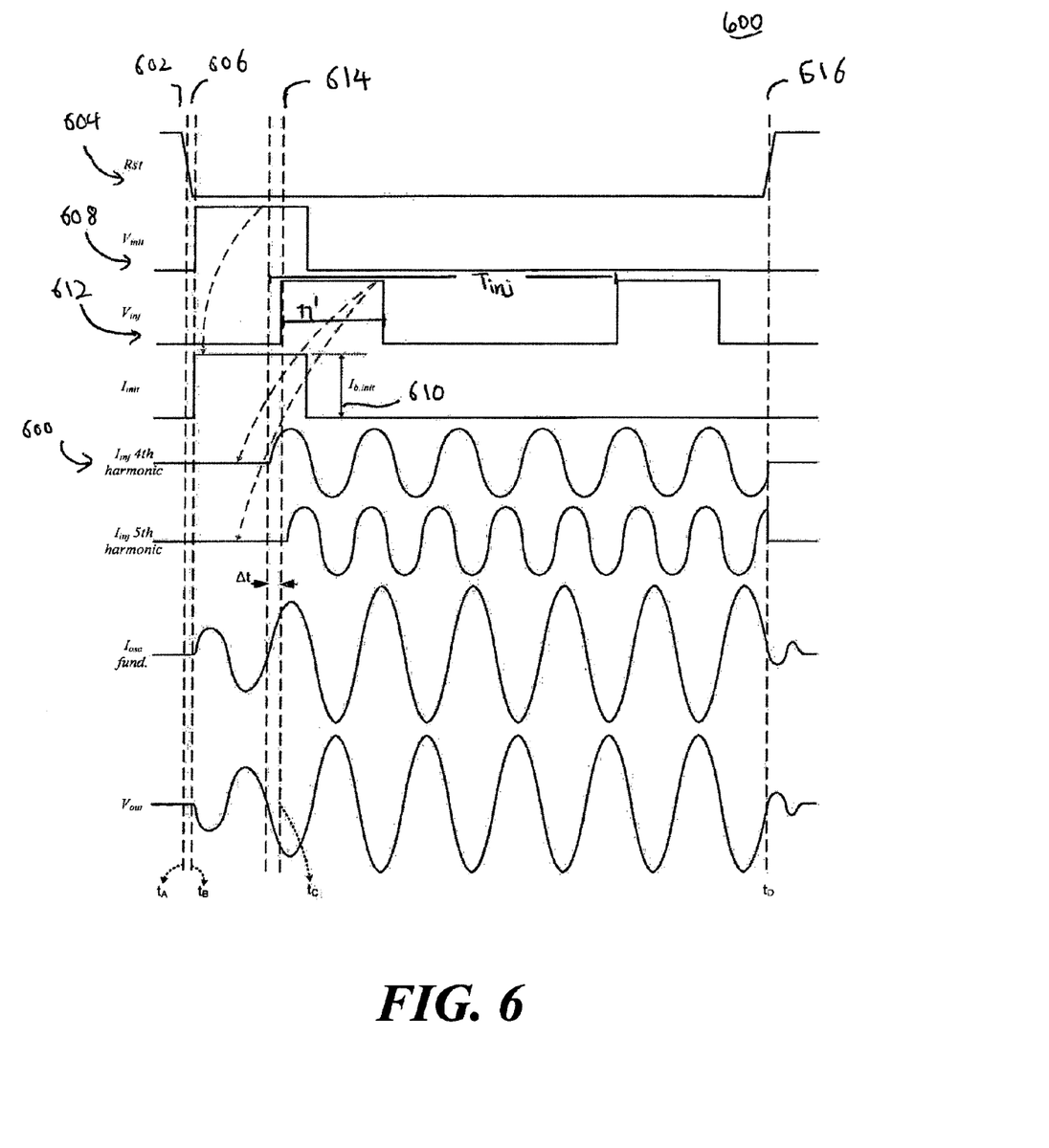
FIG. 6 is depicts timing diagrams for operation of the duty-cycled injection locked oscillator of FIG. 4 in accordance with the present embodiment.
Figure 7:
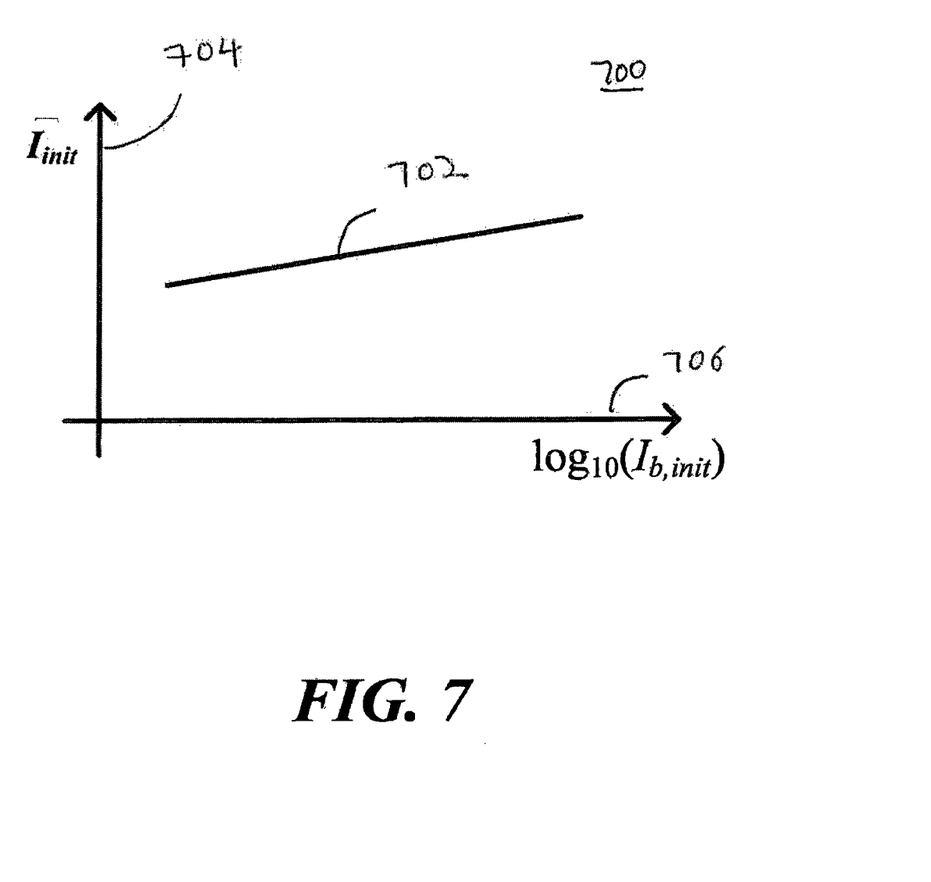
FIG. 7 is a graph depicting the relationship between the initial phase of a free-running oscillator and the logarithm of the magnitude of the initial current pulse of the oscillator of FIG. 4 in accordance with the present embodiment.

Signal timing diagrams for the single-ended alternate of embodiment 400 for burst mode injection lock oscillation is shown in FIG. 6. Taking the desired operating frequency as the fourth harmonic of the reference signal as an example, in accordance with the present embodiment, the data sets the capacitor bank such that the fourth harmonic 600 of the injection reference signal 612 is within the locking range of the oscillator 400. At time $t_A$ 602, the signal Rst 604 is disabled such that the oscillator starts to build up oscillations by noises in the circuit, the noises being on the order of nano-volts. At time $t_B$ 606, a current pulse 608 is injected into the oscillator with magnitude of $I_{b,init}$ 610. As the injected current pulse has a magnitude many orders of magnitude higher than the noise, the state of the oscillator is over-written. When the oscillator reaches steady state, the phase of the free-running oscillation is linearly related to the logarithm of $I_{b,init}$, as shown in a graph 700 in FIG. 7. The graph 700 depicts the relationship 702 between the initial phase of a free-running oscillator (plotted on the x-axis 704) and the logarithm of the magnitude of the initial current pulse of the oscillator 400, 500 (plotted on the y-axis 706) in accordance with the present embodiment.

Referring back to FIG. 6 and utilizing conventional fast-locking oscillation techniques, with the phase of the free-running oscillator fixed by $I_{b,init}$, one can inject a reference signal $V_{inj}$ 612 at an optimum timing 614 to for fast locking the oscillator 400, 500. The gated periodic injection signal $V_{inj}$ with a duty cycle of $\eta'$ and period $T_{inj}$ can be decomposed into a one-sided exponential Fourier series as $$V_{inj} = \sum_{n=0}^{\infty} c_n e^{jn\frac{2\pi}{T_{inj}}t} \quad [2]$$

where $c_n$ is the exponential Fourier series coefficients.

In conventional injection lock oscillators, the duty cycle of the injection reference signal is 50% and, in order to have frequency separation of approximately 100 MHz and operating frequencies of 400 MHz to 600 MHz for FSK operation, the ninth and eleventh harmonics of a fundamental 54.24 MHz can be used, resulting in harmonic coefficients of magnitude 0.1415 and 0.1157 respectively. In accordance with the present embodiment, the duty cycle of the injected reference signal is adjusted to 33.33%, nearly doubling the harmonic coefficients. This in turn reduces the injection signal power by approximately 75% while maintaining the same harmonic strength of the injection reference signal. More importantly, as the power of the injected harmonic directly adds into the oscillator, the equal power levels of the fourth and the fifth harmonics make the power levels of the oscillator output equal at the fourth and fifth harmonics. Subsequently, the transmitted output power levels are the same at the fourth and fifth harmonics of the reference signal, relieving the receiver for demodulation. At time $t_C$ 614, the reference signal is injected for fast locking. Subsequently, the oscillator is locked to the fourth harmonic of the reference signal. Finally at time $t_D$ 616, the signal Rst 604 is enabled and the oscillator is turned off.

In accordance with the present embodiment, a duty-cycled harmonic injection locked oscillator 400, 500 for low-power high-data rate burst-mode FSK transmission is provided which advantageously achieves constantly fast locking instead of variable locking time. As seen in the description hereinabove, an initial current pulse is injected to fix the initial phase of the free-running oscillator. The initial phase of a free-running oscillator in steady-state is linearly related to the logarithm of the magnitude of the current pulse. With the initial phase of the free-running oscillator fixed, constantly fast locking time is always achieved, leading to high data rate transmission.

Another major advantage of oscillator 400, 500 in accordance with the present embodiment is that the power of the injection reference is reduced by approximately 75% and equal-power output of FSK transmissions is achieved by modifying the duty cycle of the injection reference signal.

Thus it can be seen that a burst-mode injection-locked LC oscillator has been provided for FSK transmission in neural signal recording applications. Injection locking is used to provide accurate and stable output frequencies. An initial current pulse is injected to the oscillator to quickly start up the oscillator and to fix the initial phase of the free-running oscillator. Oscillation frequency of the free-running oscillator is tuned by a capacitor array, and with the knowledge of the initial phase and free-running frequency, a reference signal is injected at the optimum timing for fast locking. The duty-cycle of the reference signal is tuned to 33.33% to reduce its power by 75% and to provide harmonics of equal power thereby enabling the FSK transmitter 400, 500 in accordance with the present embodiment to achieve a high data rate of 54.24 Mbps with measured bit energy efficiency of 62 pJ/bit.

While at least one exemplary embodiment has been presented in the foregoing detailed description of the invention, it should be appreciated that a vast number of variations exist. It should further be appreciated that the exemplary embodiments are only examples, and are not intended to limit the scope, applicability, dimensions, or configuration of the invention in any way. Rather, the foregoing detailed description will provide those skilled in the art with a convenient road map for implementing an exemplary embodiment of the invention, it being understood that various changes may be made in the steps for fabrication and elements of the apparatus described in the exemplary embodiments without departing from the scope of the invention as set forth in the appended claims.

What is claimed is:

1. A method for fixing the initial phase of a free-running oscillator comprising:

injecting an initial current pulse into the resonant LC tank of the free-running oscillator before oscillation build up in the free-running oscillator, wherein the initial current pulse has a predetermined magnitude, wherein the initial phase of the free-running oscillator is determined by the predetermined magnitude of the initial current pulse; and locking the free-running oscillator in response to a relationship between the predetermined magnitude of the initial current pulse and a phase of the free-running oscillator.

2. The method in accordance with claim 1 wherein the step of locking the free-running oscillator comprises:

determining the relationship between the predetermined magnitude of the initial current pulse and the phase of the free-running oscillator; and locking the free-running oscillator in response to the determination.

3. The method in accordance with claim 1 wherein the initial current pulse has both a predetermined magnitude and a predetermined pulse width.

4. The method in accordance with claim 1 wherein the free-running oscillator is a differential oscillator and wherein the resonant LC tank has a first side and a second side, and wherein the step of injecting the initial current pulse into the resonant LC tank comprises the step of injecting the initial current pulse into either the first side or the second side of the resonant LC tank.

* * * * *